US008569927B2

(12) United States Patent
Morita

(10) Patent No.: US 8,569,927 B2
(45) Date of Patent: Oct. 29, 2013

(54) PIEZOELECTRIC ACTUATOR UNIT AND LIQUID TRANSPORTING APPARATUS

(75) Inventor: Yoshitsugu Morita, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 444 days.

(21) Appl. No.: 12/729,351

(22) Filed: Mar. 23, 2010

(65) Prior Publication Data

US 2010/0277524 A1    Nov. 4, 2010

(30) Foreign Application Priority Data

Apr. 30, 2009   (JP) ................ 2009-111097

(51) Int. Cl.
    *H01L 41/09*   (2006.01)
(52) U.S. Cl.
    USPC .......... 310/321; 310/315; 310/324; 310/365; 310/366
(58) Field of Classification Search
    USPC .............. 310/315, 316, 321, 324, 365, 366
    See application file for complete search history.

(56) References Cited

U.S. PATENT DOCUMENTS

| 4,608,506 | A | 8/1986 | Tanuma |
| 5,940,097 | A | 8/1999 | Imai |
| 2003/0094882 | A1* | 5/2003 | Mizuuchi ................ 310/317 |
| 2006/0132550 | A1* | 6/2006 | Sugahara .................. 347/71 |
| 2007/0103519 | A1* | 5/2007 | Takahashi et al. .......... 347/85 |
| 2008/0122455 | A1* | 5/2008 | Ohnishi et al. .............. 324/662 |
| 2009/0167823 | A1* | 7/2009 | Kojima et al. ............... 347/71 |
| 2009/0200900 | A1* | 8/2009 | Nakai et al. ................ 310/365 |

FOREIGN PATENT DOCUMENTS

| JP | S59-181585 | A | 10/1984 |
| JP | H04-273184 | A | 9/1992 |
| JP | 9-254388 | A | 9/1997 |
| JP | 2006-158127 | A | 6/2006 |
| JP | 2007-033939 | A | 2/2007 |
| JP | 2007-274848 | A | 10/2007 |
| JP | 2008-044304 | A | 2/2008 |

OTHER PUBLICATIONS

Official Action dated Aug. 20, 2013 received from the Japanese Patent Office in related application 2009-111097.

* cited by examiner

*Primary Examiner* — Derek Rosenau
*Assistant Examiner* — Bryan Gordon
(74) *Attorney, Agent, or Firm* — Scully, Scott, Murphy & Presser PC

(57) ABSTRACT

A piezoelectric actuator unit includes a piezoelectric layer, a first electrode and a second electrode which are arranged to be sandwiching the piezoelectric layer, and which form an active portion of the piezoelectric layer by sandwiching the piezoelectric layer, a capacitor which is connected in series to the active portion, and a voltage applying mechanism which applies a first voltage to the capacitor, and a second voltage between the first electrode and the second electrode to cause a piezoelectric deformation in the active portion of the piezoelectric layer.

14 Claims, 8 Drawing Sheets

PIEZOELECTRIC ACTUATOR UNIT AND LIQUID TRANSPORTING APPARATUS

CROSS REFERENCE TO RELATED APPLICATION

The present application claims priority from Japanese Patent Application No. 2009-111097, filed on Apr. 30, 2009, the disclosure of which is incorporated herein by reference in its entirety.

BACKGROUND OF THE INVENTION

1. Field of the Invention

The present invention relates to a piezoelectric actuator unit, and a liquid transporting apparatus using the piezoelectric actuator unit.

2. Description of the Related Art

A piezoelectric actuator which drives an object by using a piezoelectric deformation (also called as a piezoelectric distortion) of a piezoelectric layer has hitherto been used in various technical fields. A common piezoelectric actuator includes a piezoelectric layer and two types of electrodes provided to the piezoelectric layer, and causes a piezoelectric deformation in a portion of the piezoelectric layer sandwiched between these two types of electrodes (hereinafter, called as an 'active portion') by applying a voltage between the two types of electrodes.

Incidentally, in the abovementioned piezoelectric actuator, sometimes there is a short-circuit between the two types of electrodes or a dielectric breakdown of the active portion due to a crack in the active portion or a phenomenon such as a migration of an electrode material. At this time, an overcurrent (an excess electric current) passes between the two types of electrodes, and there is a trouble such as a breakdown of a circuit component.

An apparatus which detects a breakdown due to short-circuit of a piezoelectric element (active portion) of a piezoelectric actuator for an ink jet recording apparatus has been disclosed in Japanese Patent Application Laid-open No. 2008-44304. This apparatus detects the short-circuit by detecting a leakage current when a DC voltage is applied to the active portion.

SUMMARY OF THE INVENTION

The abovementioned short-circuit breakdown detecting apparatus detects the leakage current (overcurrent) by applying a DC voltage between the two types of electrodes at a predetermined detection timing. Therefore, it is possible to only detect the overcurrent generated at a timing at which the voltage is applied. In other words, even though a short-circuit causing the overcurrent occurs between the electrodes at a timing other than the predetermined detection timing, it is not possible to detect the overcurrent immediately. Therefore, an occurrence of a trouble such as a breakdown of a circuit component by delayed detection of the overcurrent may not be prevented in advance.

An object of the present invention is to provide a piezoelectric actuator unit in which it is possible to prevent assuredly the overcurrent when there is a short-circuit between the two types of electrodes sandwiching the active portion, or a dielectric breakdown of the active portion.

According to a first aspect of the present invention, there is provided a piezoelectric actuator unit including a piezoelectric layer;

a first electrode and a second electrode which are arranged to sandwich the piezoelectric layer therebetween to form an active portion of the piezoelectric layer;

a capacitor which is connected in series to the active portion; and a voltage applying mechanism which applies a first voltage to the capacitor, and applies a second voltage between the first electrode and the second electrode to cause a piezoelectric deformation in the active portion of the piezoelectric layer.

The active portion made of an insulating piezoelectric material, which is sandwiched between the two types of electrodes functions as a kind of a capacitor having a certain fixed electrostatic capacity. In other words, when a voltage is applied between the two types of electrodes, an electric field acts and a piezoelectric deformation is caused in the active portion, and a charging of the active portion is carried out, thereby accumulating an electric charge. Here, when there is a dielectric breakdown in the action portion or when there is a short-circuit between the two types of electrodes sandwiching the active portion due to a crack in the active portion or a migration of an electrode material, there is a fear that an overcurrent (direct current electricity) flows between the two types of electrodes. However, in the present invention, the active portion and the capacitor are connected in series. Therefore, one of the two types of electrodes sandwiching the active portion, and the voltage applying mechanism are insulated by the capacitor, and the overcurrent is prevented from flowing. On the other hand, charging and discharging of the active portion when the voltage between the two types of electrodes is changed in a normal state is not inhibited by the capacitor, it is possible to cause a piezoelectric deformation in the action portion.

According to a second aspect of the present invention, there is provided a liquid transporting apparatus which transports a liquid, including a channel unit in which liquid channels including pressure chambers are formed; and a piezoelectric actuator unit which is arranged on the channel unit and which applies a pressure to the liquid in the pressure chambers, the piezoelectric actuator unit including:

a piezoelectric layer which is arranged to cover the pressure chambers;

first electrodes and second electrodes which are arranged in areas, of the piezoelectric layer, facing the pressure chambers, and which are arranged to sandwich the piezoelectric layer therebetween to form active portions of the piezoelectric layer;

a capacitor which is connected in series to the active portions; and a voltage applying mechanism which applies a first voltage to the capacitor, and a second voltage between one of the first electrodes and one of the second electrodes to cause a piezoelectric deformation in one of the active portions of the piezoelectric layer.

Particularly, in a piezoelectric actuator unit for a liquid transporting apparatus, when there is a crack in the piezoelectric layer, a short-circuit sometimes occurs between the two types of electrodes due to a liquid entering into the crack. However, in the present invention, since the capacitor is connected in series to the active portions, one of the two types of electrodes and a voltage applying mechanism are insulated by the capacitor. Therefore, even when there is a short circuit between the two types of electrodes, the overcurrent does not flow. In the present patent application, an expression "the capacitor is provided between the common electrode and the voltage applying mechanism" does not mean that the capacitor is arranged physically at a position between the common electrode and the voltage applying mechanism but means that the capacitor is arranged electrically between the common electrode and the voltage applying mechanism. In other words, the expression means that the capacitor is provided between the common electrode and the voltage applying mechanism, in an equivalent circuit.

DETAILED DESCRIPTION OF THE PREFERRED EMBODIMENTS

First Embodiment

Next, a first embodiment of the present teaching will be described below. In the first embodiment, the present teaching is applied to an ink-jet head which is an example of a liquid transporting apparatus which jets droplets of ink from nozzles onto a recording paper.

Figure 1:
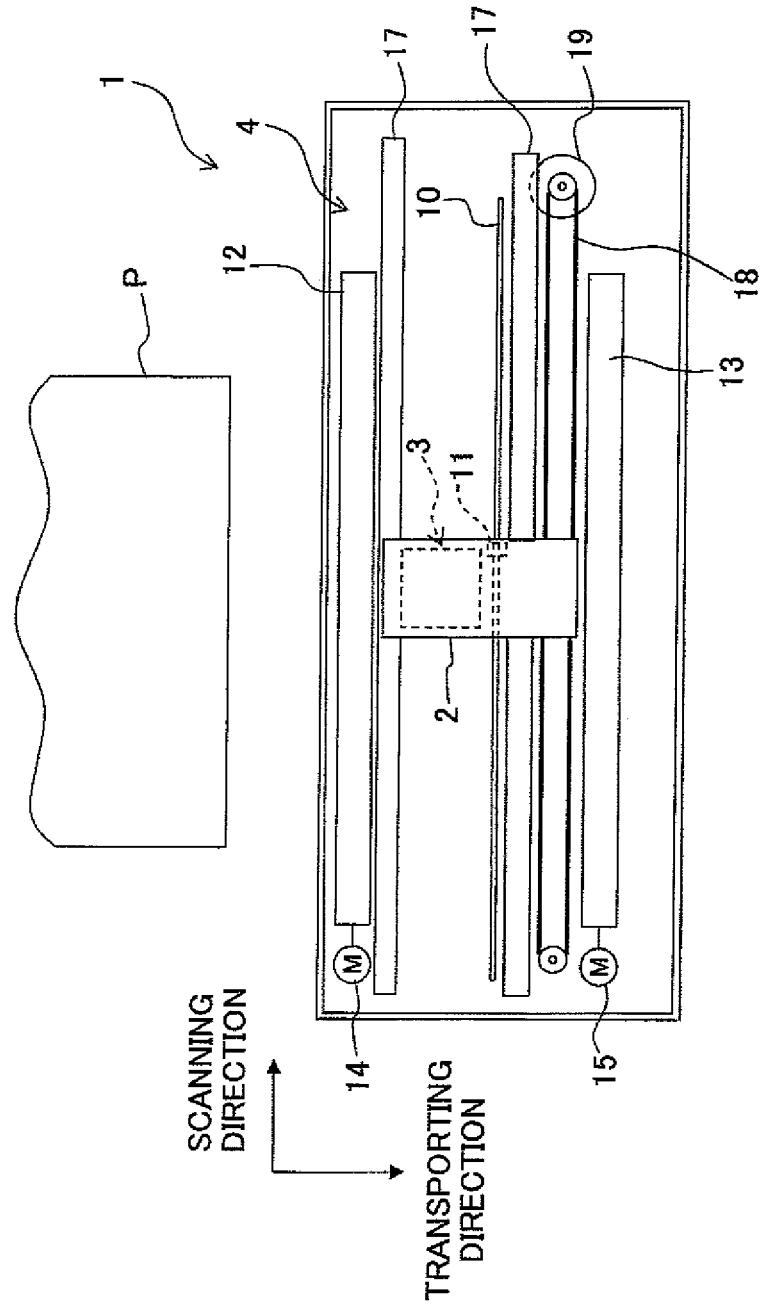
FIG. 1 is a schematic plan view of a printer according to a first embodiment.

Firstly, a structure of a printer 1 of the first embodiment including an ink-jet head will be described below. As shown in FIG. 1, the printer 1 includes a carriage 2 which reciprocates along a predetermined scanning direction (left-right direction in FIG. 1), an ink-jet head 3 which is mounted on the carriage 2, and a transporting mechanism 4 which transports a recording paper P in a transporting direction orthogonal to the scanning direction.

The carriage 2 reciprocates along two guide shafts 17 extended parallel to the scanning direction (left-right direction in FIG. 1). Moreover, an endless belt 18 is linked to the carriage 2. When the endless belt 18 is driven by a carriage driving motor 19, the carriage 2 moves in the scanning direction with the running of the endless belt. A linear encoder 10 having a plurality of light transmission portions (slits) which are aligned at intervals in the scanning direction is provided to the printer 1. On the other hand, a photosensor 11 of a transmission type having a light emitting element and a light receiving element is provided to the carriage 2. During the movement of the carriage 2, the photosensor 11 counts the number of the passing transmission portions of the linear encoder 10. The printer 1 determines a current position of the carriage 2 in the scanning direction based on a detected value (detection counts) of the photosensor 11.

An ink-jet head 3 is mounted on the carriage 2. As shown in FIGS. 2 to 5, a plurality of nozzles 30 is formed in a lower surface of the ink-jet head 3 (a surface on a reverse side of a paper plane in FIG. 1). The ink-jet head 3 jets ink supplied from an ink cartridge (not shown in the diagram) via the plurality of nozzles 30 onto the recording paper P transported downward (in a transporting direction) in FIG. 1 by the transporting mechanism 4.

The transporting mechanism 4 includes a paper feeding roller 12 arranged at a downstream side of the ink-jet head 3 in the transporting direction, and a paper discharging roller 13 arranged at an upstream side of the ink jet head 3 in the transporting direction. The paper feeding roller 12 and the paper discharging roller 13 are driven and rotated by a paper feeding motor 14 and a paper discharge motor 15. Moreover, the transporting mechanism 4 transports the recording paper P from an upper side in FIG. 1 to the ink-jet head 3 by the paper feeding roller 12, and discharges the recording paper P on which an image and/or characters are recorded by the ink-jet head 3, in a downward direction in FIG. 1.

Next, the ink jet head 3 (a liquid transporting apparatus) will be described below. As shown in FIGS. 2 to 5, the ink-jet head 3 includes a channel unit 6 in which ink channels each having the nozzle 30 and the pressure chamber 24 are formed, and a piezoelectric actuator unit 7 which applies a pressure to the ink in the pressure chamber 24.

Figure 4:
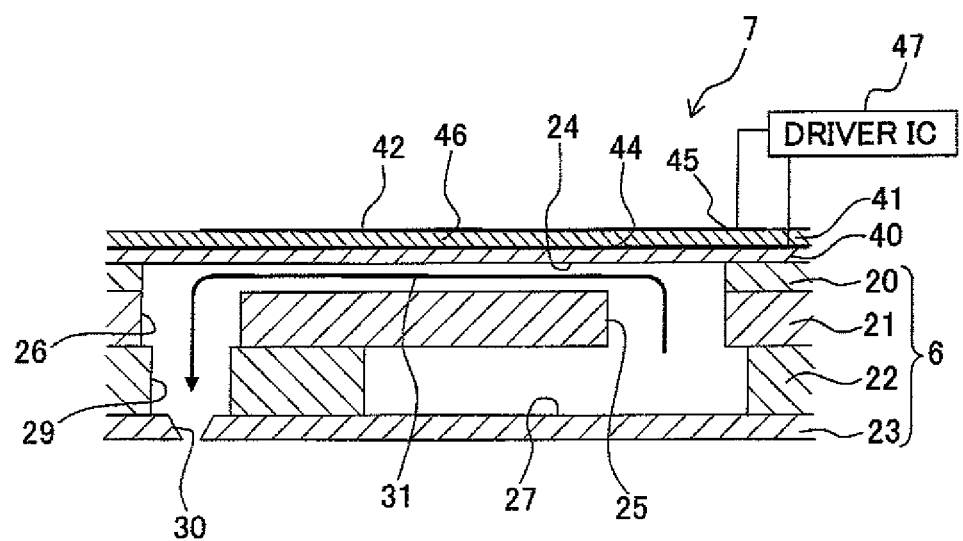
FIG. 4 is a cross-sectional view taken along a IV-IV line in FIG. 3.
Figure 5:
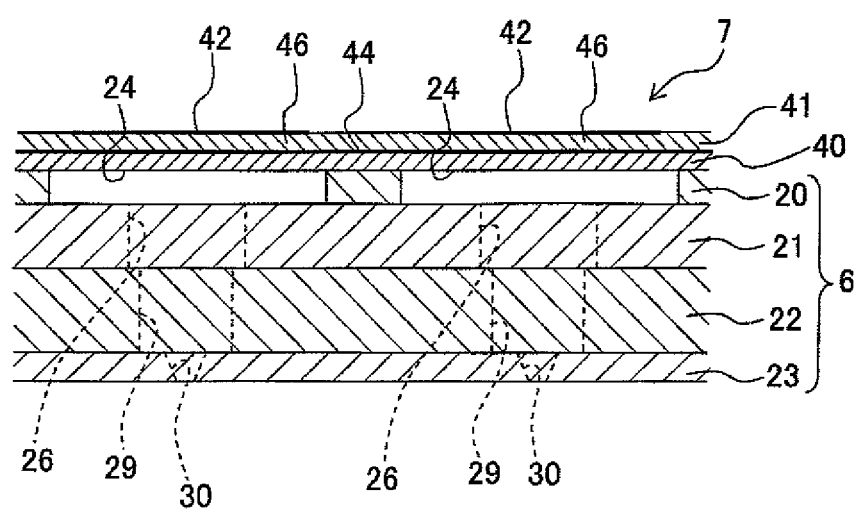
FIG. 5 is a cross-sectional view taken along a V-V line in FIG. 3.

Firstly, the channel unit 6 will be described below. As shown in FIGS. 4 and 5, the channel unit 6 includes a cavity plate 20, a base plate 21, a manifold plate 22, and a nozzle plate 23, and these four plates 20 to 23 are joined in a stacked state. The cavity plate 20, the base plate 21, and the manifold plate 22 are substantially rectangular plates in a plan view, which are made of a metallic material such as stainless steel. Therefore, the ink channels such as the pressure chambers 24 and a manifold 27 which will be described later can be formed easily by etching in these three plates 20 to 22. Moreover, the nozzle plate 23 is formed of a high-molecular synthetic resin material such as polyimide, and is joined to a lower surface of the manifold plate 22 by an adhesive. Alternatively, the nozzle plate 23 may be formed of a metallic material such as stainless steel similarly as the other three plates 20 to 22.

As shown in FIGS. 2 to 5, the plurality of pressure chambers 24 arranged in a row along a plane is formed, in the cavity plate 20 located at the top of the four plates 20 to 23, by holes penetrating the cavity plate 20. Moreover, the plurality of pressure chambers 24 is arranged in two rows in a zigzag form in the transporting direction (vertical direction in FIG. 2). Moreover, as shown in FIGS. 4 and 5, the plurality of pressure chambers 24 is covered by the base plate 21 and a piezoelectric layer 40 of the piezoelectric actuator unit 7 which will be described later, from both sides of the pressure chambers 24 (an upper and a lower side of the pressure chambers 24). Furthermore, each of the pressure chambers 24 is formed to have a substantially elliptical shape of which longitudinal axis is parallel to the scanning direction (left-right direction in FIG. 1) in a plan view.

Figure 3:
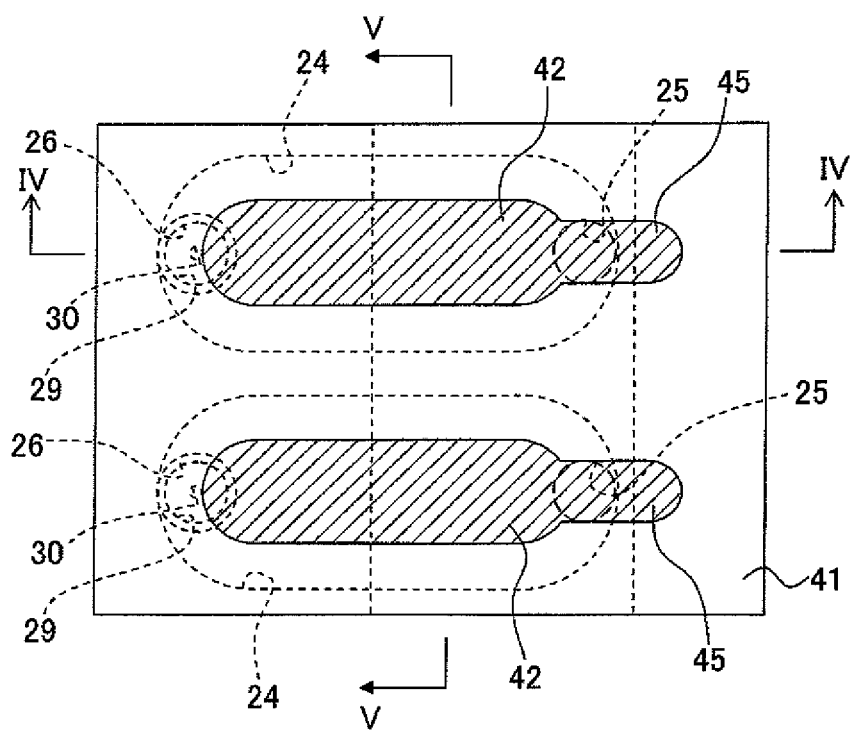
FIG. 3 is a partially enlarged view of FIG. 2.

As shown in FIGS. 3 and 4, communicating holes 25 and 26 are formed in the base plate 21 at positions overlapping with two end portions in a longitudinal direction of the pressure chamber 24 in a plan view. Moreover, two manifolds 27 extended in the transporting direction are formed in the manifold plate 22 to overlap with the pressure chambers 24, arranged in two rows, at a portion on a side of the communicating holes 25. These two manifolds 27 communicate with an ink supply port 28 formed in the cavity plate 20, and the ink is supplied to the manifolds 27 from an ink tank not shown in the diagram, via the ink supply port 28. Furthermore, a plurality of communicating holes 29 which communicate with the communicating holes 26 respectively is formed in the manifold plate 22 at positions overlapping with end portions, of the pressure chambers 24, on a side opposite to the manifold 27 in a plan view.

Furthermore, the plurality of nozzles 30 is formed in the nozzle plate 23 at positions overlapping with the communicating holes 29 respectively in a plan view. As shown in FIG.

2, the plurality of nozzles 30 is arranged to overlap with the end portions, on the side opposite to the manifold 27, of the pressure chambers 24 arranged in two rows in the transporting direction.

Moreover, as shown in FIG. 4, the manifold 27 communicates with the pressure chamber 24 via the communicating holes 25, and furthermore, the pressure chamber 24 communicate with the nozzle 30 via the communicating holes 26 and 29. In this manner, a plurality of individual ink channels 31 from the manifold 27 up to the nozzles 30 through the pressure chamber 24 is formed in the channel unit 6.

Figure 2:
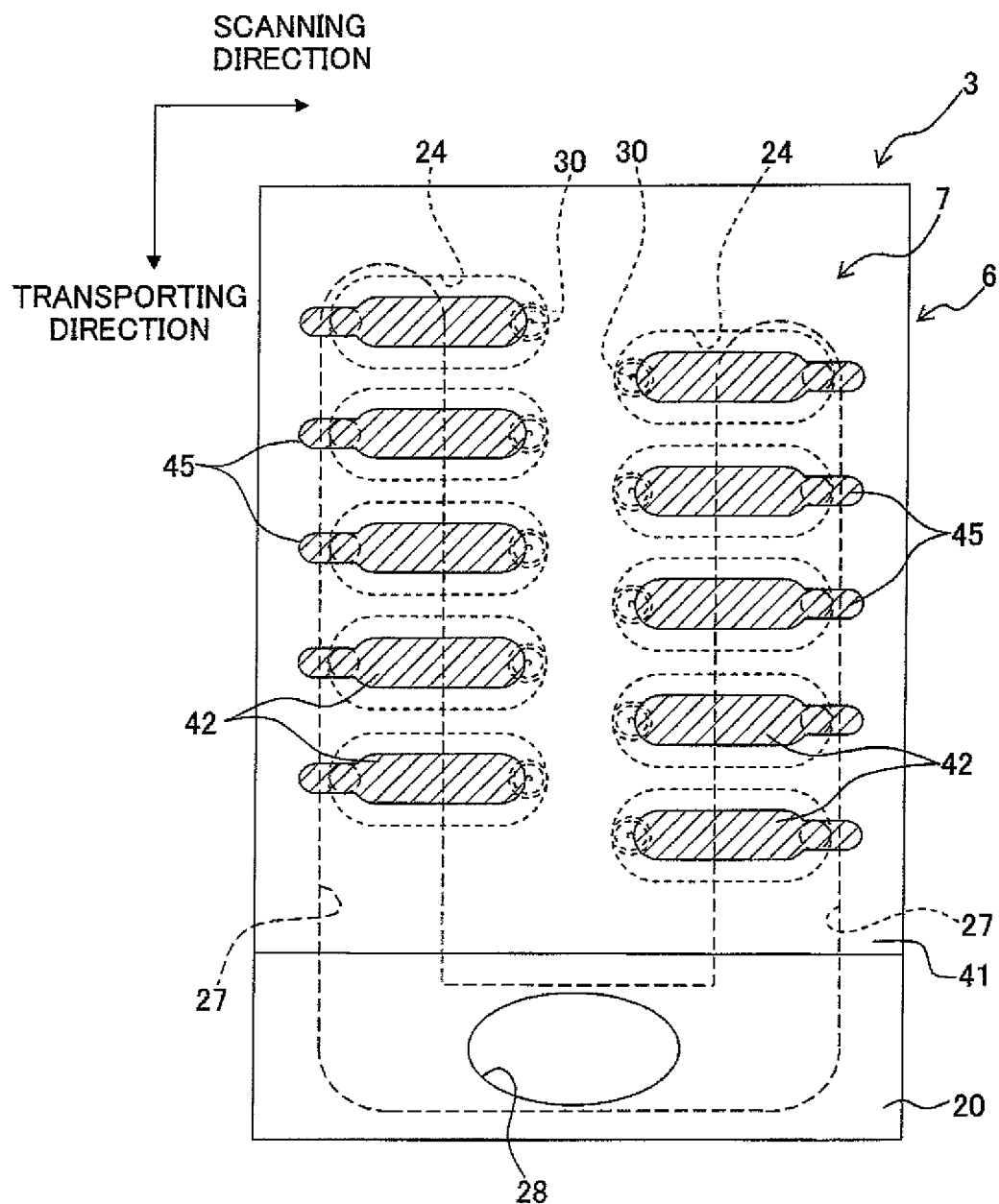
FIG. 2 is a plan view of an ink-jet head.

In FIG. 2, for simplifying the description, only one group of interconnected channels (including the manifolds 27, the pressure chambers 24, and the nozzles 30) communicating with one ink supply port 28 is indicated. However, the present teachings are not restricted to the one group of interconnected channels. For instance, the ink-jet head 3 may have a plurality of groups of interconnected channels arranged side-by-side in the scanning direction, and furthermore, the ink-jet head 3 may be a color ink-jet head which has a plurality of groups of interconnected channels for jetting different color inks (for example, four colors namely, black, yellow, cyan, and magenta).

Next, the piezoelectric actuator unit 7 will be described below. As shown in FIGS. 2 to 5, the piezoelectric actuator unit 7 includes two piezoelectric layers 40 and 41 arranged on an upper surface of the channel unit 6, a plurality of individual electrodes (first electrodes) 42 provided to the piezoelectric layers 40 and 41, a common electrode (a second electrode) 44, and a driver IC 47 (a voltage applying mechanism) which applies a drive voltage between the plurality of individual electrodes 42 and the common electrode 44.

The two piezoelectric layers 40 and 41 are formed of a piezoelectric material containing a main component of lead zirconate titanate (PZT) which is a ferroelectric and which is a solid solution of lead titanate and lead zirconate, and the piezoelectric layer 41 is stacked on the piezoelectric layer 40. Moreover, the lower piezoelectric layer 40 is joined to the upper surface of the channel unit 6 (the cavity plate 20) while covering the plurality of pressure chambers 24.

The plurality of individual electrodes 42 is arranged on an upper surface of the upper piezoelectric layer 41, in an area facing the plurality of pressure chambers 24. Each of the individual electrodes 42 has a substantially elliptical shape slightly smaller than one of the pressure chambers 24 in a plan view, and faces a central portion of the one of the pressure chambers 24. Moreover, as shown in FIG. 2, a plurality of contact point portions 45 is drawn from end portions of the individual electrodes 42 along a longitudinal direction of the individual electrodes 42. The contact point portions 45 are electrically connected to the driver IC 47 via a flexible printed circuit (FPC) not shown in the diagram. On the other hand, the common electrode 44 which faces in common the individual electrodes 42 is arranged between the two piezoelectric layers 40 and 41 so that the piezoelectric layer 41 is sandwiched between the common electrode 44 and the individual electrodes 42.

The driver IC 47 switches an electric potential of the individual electrodes 42 between a ground electric potential (a first electric potential) and a predetermined driving electric potential (a second electric potential) which is different from the ground electric potential. Moreover, the driver IC 47 keeps an electric potential of the common electrode 44 to the ground electric potential all the time. Consequently, when the driving electric potential is applied to a certain individual electrode 42 by the driver IC 47, a predetermined voltage (an electric potential difference) is generated between this individual electrode 42 and the common electrode 44 which is kept at the ground electric potential all the time.

Moreover, a portion, of the upper piezoelectric layer 41, sandwiched between the individual electrode 42 and the common electrode 44 is polarized in advance in a thickness direction thereof to form an active portion 46. When a voltage is applied between two types of electrodes namely the individual electrode 42 and the common electrode 44 by the driver IC 47, a piezoelectric deformation (a piezoelectric distortion) is caused in the active portion 46.

Next, an operation of the piezoelectric actuator unit 7 at the time of ink jetting will be described below. When a driving electric potential is applied to a certain individual electrode 42 by the driver IC 47, a voltage is applied between this individual electrode 42 and the common electrode 44. At this time, an electric field in the thickness direction is generated in the active portion 46 sandwiched between the individual electrode 42 and the common electrode 44. Since a direction of the electric field is parallel to a polarization direction in which the active portion 46 is polarized, the active portion 46 contracts in a planar direction (in a direction parallel to a plane of the piezoelectric layer 41) orthogonal to the thickness direction. Moreover, the lower piezoelectric layer 40 is fixed to the cavity plate 20. Therefore, upon contracting the active portion 46 of the upper piezoelectric layer 41 in the planar direction, a portion of the lower piezoelectric layer 40 facing the pressure chamber 24 is deformed to form a projection toward the pressure chamber 24 (unimorph deformation). At this time, since a volume inside the pressure chamber 24 decreases, a pressure of the ink in the pressure chamber 24 increases and the ink is jetted from the nozzle 30 communicating with this pressure chamber 24.

The piezoelectric layer 41 (the active portion 46) made of a piezoelectric material which is an insulating material exists between the individual electrode 42 and the common electrode 44. Therefore, even when the voltage is applied between the individual electrode 42 and the common electrode 44, in a normal state, direct current electricity does not flow between the individual electrode 42 and the common electrode 44. However, for instance, when there is a crack in the piezoelectric layers 40 and 41, the ink in the pressure chamber 24 or an ink in the form of mist floating around the piezoelectric layers 40 and 41 sometimes enters into the crack. In this case, sometimes, there is a short-circuit between the individual electrode 42 and the common electrode 44. Moreover, when the voltage is applied between the individual electrode 42 and the common electrode 44, a phenomenon in which an electrode material moves from an anode (individual electrode 42) toward a cathode (common electrode 44) along the direction of the electric field in the active portion 46 (migration effect), and accordingly, sometimes there is a short-circuit. Furthermore, when the active portion 46 is thin, the strength of the electric field acting on the active portion 46 may exceed a breakdown field strength. In such a case, a dielectric breakdown may occur due to an excessive strong electric field strength. Moreover, when there is a short-circuit between the individual electrode 42 and the common electrode 44 or a dielectric breakdown of the active portion 46, a substantial direct current electricity (overcurrent) flows between the individual electrode 42 and the common electrode 44.

When such overcurrent is generated, an electric current surpassing an acceptable value flows through circuit components such as the driver IC 47, and there is a possibility of a breakdown of a circuit component. Moreover, an electrolysis reaction may occur, in which moisture in the ink entered into the crack is electrolyzed by the direct current electricity flowing between the individual electrode 42 and the common electrode 42. In this case, oxygen gas is generated at the anode (the individual electrode 42), and hydrogen gas is generated at the cathode (the common electrode 44). A problem such as an exfoliation or a delamination of the piezoelectric layers 40 and 41 also arises due to a local pressure rise when the gases are generated. Therefore, the piezoelectric actuator unit 7 of the first embodiment is structured such that, even when a short-circuit between the individual electrode 42 and the common electrode 44 or a dielectric breakdown of the active portion 46 occurs, the overcurrent is inhibited.

Figure 6:
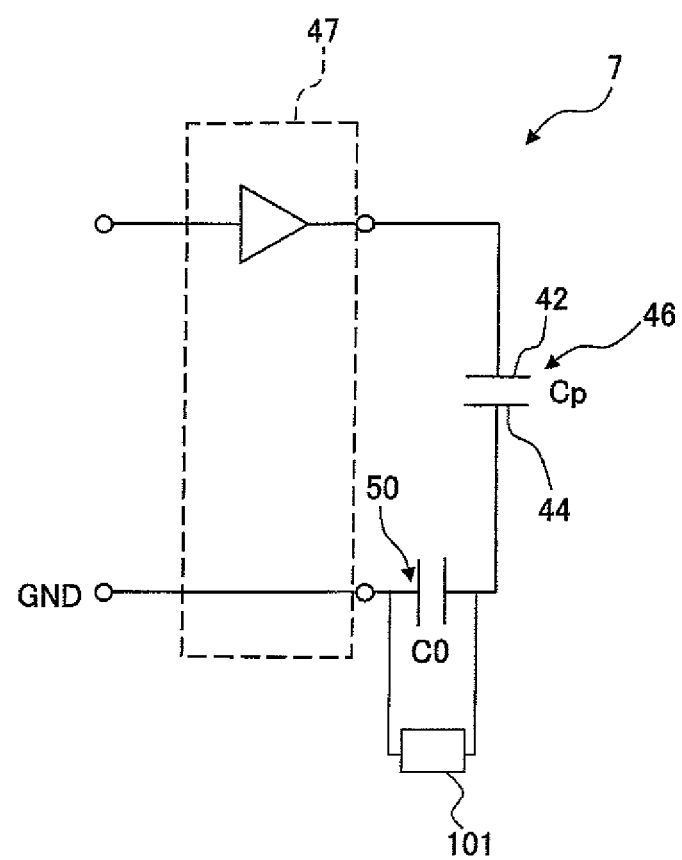
FIG. 6 is a diagram of an equivalent circuit of a piezoelectric actuator unit of the first embodiment.

As shown in FIG. 6, the individual electrode 42, the common electrode 44 and the active portion 46, made of the insulating piezoelectric material, sandwiched between the individual electrode 42 and the common electrode 44 function as a capacitor having a certain constant electrostatic capacity. In other words, when the electric voltage is applied between the individual electrode 42 and the common electrode 44, the electric field acts to develop the piezoelectric deformation in the active portion 46, and the capacitor corresponding to the active portion 46 is electrically charged and electric charge is accumulated therein. Moreover, when the voltage between the individual electrode 42 and the common electrode 44 has become zero (the electric potential of the individual electrode 42 is ground electric potential), the active portion 46 returns to an original shape while discharging the electric charged which had been accumulated. Consequently, as shown in FIG. 6, it is possible to express the active portion by a capacitor element of an electrostatic capacity Cp. Moreover, in FIG. 6, although only one active portion 46 is shown, practically, the same number of capacitor elements of the electrostatic capacity Cp as the number of the individual electrodes connected to the driver IC 47 independently, exist.

The common electrode 44 is connected to a ground terminal (GND) of the driver IC 47, and the ground electric potential is applied all the time to the common electrode 44. Moreover, one of the ground electric potential and the driving electric potential is selectively applied to the individual electrode 42. Furthermore, a capacitor 50 of the electrostatic capacity C0 which is connected serially to the active portion 46 is provided between the common electrode 44 and the ground terminal (GND) of the driver IC 47.

In a normal state, even when the voltage is applied between the individual electrode 42 and the common electrode 44, direct current electricity does not flow between the individual electrode 42 and the common electrode 44. However, when there is a short-circuit between the individual electrode 42 and the common electrode 44, or when there is a dielectric breakdown of the active portion 46, there is a fear that a substantial direct current electricity flows between the individual electrode 42 and the common electrode 44. However, since the capacitor 50 is arranged between the common electrode 44 and the driver IC 47, the common electrode 44 and the driver IC 47 are isolated electrically. Therefore, even when there is a short-circuit between the individual electrode 42 and the common electrode 44, the overcurrent does not flow. On the other hand, when the voltage is applied between the individual electrode 42 and the common electrode 44 in a normal state, the charging and discharging of the capacitor corresponding to the active portion 46 is not inhibited by the capacitor 50, and it is possible to cause a piezoelectric deformation in the active portion 46.

Even in a case in which the capacitor 50 is provided between the individual electrode 42 and the driver IC 47, it is thought to be able to achieve an effect similar to the above-mentioned effect. However, since the individual electrodes 42 are connected to the driver IC 47 in parallel, it is necessary to provide a plurality of capacitors 50 between the individual electrodes 42 and output terminals of the driver IC 47. Therefore, the number of required capacitors 50 increases and there is an increase in a cost, and it is necessary to secure a space for installing the large number of capacitors 50 in the FPC which connects the driver IC and the individual electrodes 42. On the other hand, in the first embodiment, since it is possible to prevent the generation of the overcurrent in all the active portions only by providing one capacitor 50 on the side of the common electrode 44, it is possible to suppress the rise in cost, and moreover, it is possible to make the size small by making small an installation space of the capacitor 50.

Moreover, an output voltage of the driver IC 47 is divided into the capacitor 50 and the active portion 46 connected serially. Concretely, when the output voltage of the driver IC 47 is let to be E, the voltage (a second voltage) applied to the active portion 46 is let to be Vp, and the total number of the active portions 46 (individual electrodes 42) is let to be n, Vp is indicated by Eq. 1.

$$Vp = C0 \times E/(C0 + (n \times Cp)) \qquad \text{<Eq. 1>}$$

As it is evident from Eq. 1, larger the electrostatic capacity of the capacitor 50 (C0), higher is a value of the voltage Vp applied to the active portion 46. In other words, from a point of view of securing the minimum voltage required for jetting the ink normally from the nozzle 30 by making small the voltage (a first voltage) to be applied to the capacitor 50, it is preferable that the electrostatic capacity C0 of the capacitor 50 is higher than (more than) the sum total n×Cp of the electrostatic capacity Cp of the capacitor component corresponding to the active portions.

Furthermore, the electrostatic capacity C0 of the capacitor 50 will be explained in detail. When a ratio of the minimum voltage Vp required for deforming the active portion with respect to the output voltage E of the driver IC 47 is defined as an allowable ratio α, a relationship in Eq. 2 is satisfied. Furthermore, substituting Eq. 2 into Eq. 1 to eliminate Vp, a relationship in Eq. 3 is obtained. Consequently, when the allowable ratio α is set to a predetermined value, the electrostatic capacity C0 of the capacitor 50 is to be set not to be less than a right-side value in Eq. 3.

$$Vp = \alpha \times E \qquad \text{<Eq. 2>}$$

$$C0 = (\alpha/(1-\alpha)) \times (n \times Cp) \qquad \text{<Eq. 3>}$$

Moreover, some methods for determining the allowable ratio α are available. In one of the methods, α is to be determined based on an allowable voltage loss (%) in the capacitor 50. From this point of view, when the specification of the output voltage of the driver IC 47 is enough high (substantial) with respect to the minimum voltage Vp required, it is possible to make the allowable ratio α small, and when the specification of the output voltage of the driver IC 47 is not so high, it is necessary to make the allowable ratio α substantial.

The voltage Vp to be applied to each of the active portions 46 varies according to the number of nozzles 30 jetting the ink at the same time (in other words, the number of active portions 46 which are driven at the same time). Therefore, the value of α should be determined so that the difference of the voltage Vp, between a case in which the number of nozzles 30 jetting the ink simultaneously is large and a case in which the number of nozzles 30 jetting the ink simultaneously is small, does not affect on jetting characteristics of ink.

This will be described below by citing a concrete example. Assume that E=30 V, n=800, Cp=150 pF, and α is set to be α=0.99, then the electrostatic capacity C0 of the capacitor 50 is obtained as C0=11.9 nF=11900 pF, from Eq. 3. Moreover, in a case of jetting the ink from all the nozzles 30, the voltage Vp to be applied to each of the active portions 46 is 30×0.99=29.7 (V), and a voltage loss which is to be applied to the capacitor 50 is 30−29.7=0.3 (V).

On the other hand, when the number of nozzles 30 jetting the ink is one, the voltage Vp to be applied to the active portion 46 corresponding to that nozzle 30 is obtained by substituting C0=11.9 nF, n=1, and Cp=150 pF, and is almost 30 V. Consequently, in a case of jetting ink from all the nozzles 30, and in a case of jetting the ink from only one nozzle 30, the difference of voltage to be applied to each of the active portions 46 is 0.3 V. This difference of voltage is within a range which does not affect the jetting characteristics of ink.

In other words, a permissible range of variation of the voltage Vp which does not have an effect on the jetting characteristics of ink may be determined in advance. Then the allowable ratio α can be determined so that the difference in the voltage Vp to be applied to each of the active portion 46, between the case in which the ink is to be jetted from all the nozzles 30 and the case in which the ink is to be jetted from only one nozzle 30, is accommodated within the permissible range of variation. Moreover, in a case of manufacturing the plurality of actuator units 7, sometimes there is a variation in the electrostatic capacity Cp of the active portions 46 due to a variation in manufacturing of the actuator units 7. In such case, the electrostatic capacity C0 of the capacitor 50 may be determined such that the allowable ratio α which is determined as mentioned above, can be achieved for the actuator unit 7 for which the electrostatic capacity Cp of the active portion 46 is substantial (high). By making such an arrangement, it is possible to achieve the allowable ratio α for all the actuator units 7.

As it has been described above, the output voltage of the driver IC 47 is divided into the active portions 46 and the capacitor 50 connected in series with respect to the respective active portion 46. However, when there is a short-circuit between the individual electrode 42 and the common electrode 44, or when there is a dielectric breakdown of the active portion 46, the voltage applied to the active portion 46 is lowered, and the voltage applied to the capacitor 50 becomes high. For instance, when there is a complete dielectric breakdown of a certain active portion 46, the voltage applied to the active portion 46 becomes almost zero, and the output voltage of the driver IC 47 is entirely applied to the capacitor 50. In other words, when all the active portions 46 are normal, as it has been described above, a voltage in a range of the voltage loss determined according to the allowable ratio α is applied to the capacitor 50. However, when there is a short-circuit or a dielectric breakdown in any of the active portions 46, a high voltage surpassing the range of the assumed voltage loss is applied to the capacitor 50. Therefore, it is possible to detect whether or not a short-circuit or a dielectric breakdown occurs in any of the active portions 46 by monitoring the voltage applied to the capacitor 50 by a voltage detector 101 such as a voltmeter. In the present teaching, the voltage detector 101 is not necessarily a measuring equipment which measures the value of the voltage applied to the capacitor 50, and any types of voltage detector are available in so far as the voltage detector is capable of detecting whether or not the voltage applied to the capacitor 50 is higher than a predetermined voltage.

Second Embodiment

Next, a second embodiment of the present teaching will be described below. Regarding an ink-jet head of the second embodiment, a structure of a piezoelectric actuator unit of the ink jet head of the second embodiment differs from the structure of the piezoelectric actuator unit of the first embodiment, and a structure of rest of the components in the ink-jet head is same as in the first embodiment. Same reference numerals are assigned to components which are same as in the first embodiment, and description of such components is omitted.

Figure 7:
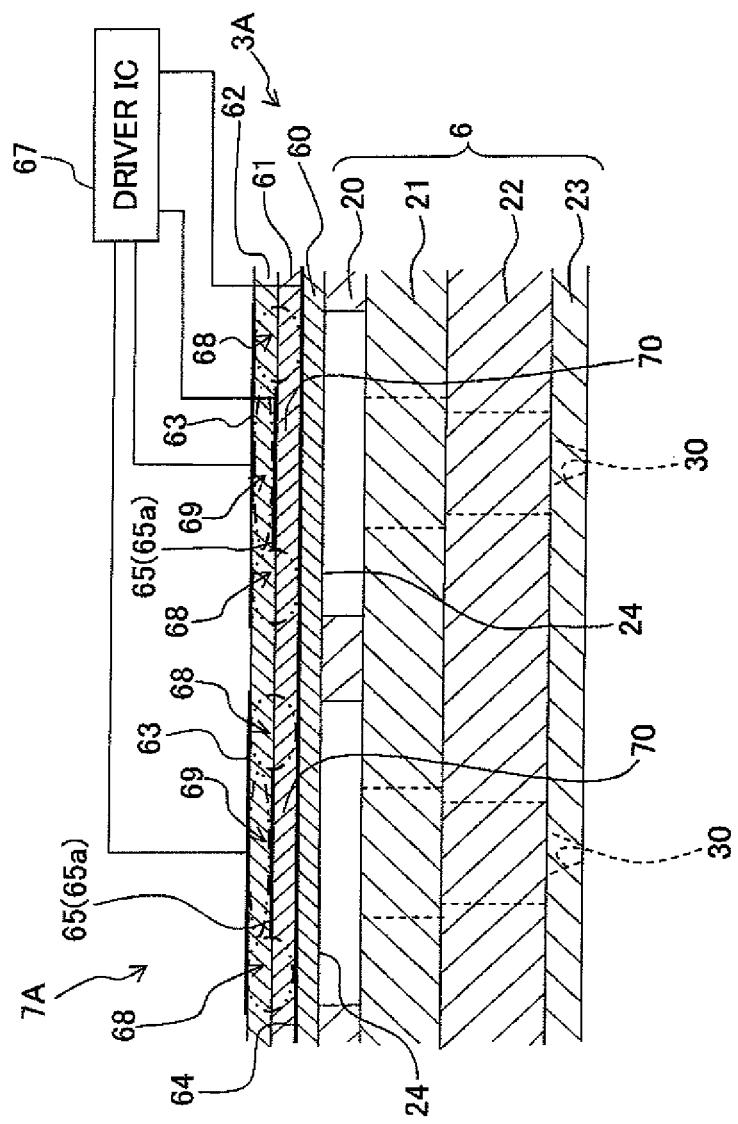
FIG. 7 is a cross-sectional view equivalent to FIG. 5, of an ink jet head according to a second embodiment.

As shown in FIG. 7, a piezoelectric actuator unit 7A of the second embodiment includes three piezoelectric layers 60, 61, and 62, a plurality of individual electrodes 63, a first common electrode 64, and a second common electrode 65.

Each of the piezoelectric layers 60 to 62 is formed of a ferroelectric piezoelectric material containing a main component of lead zirconate titanate which is a mixed crystal of lead titanate and lead zirconate, and the bottom piezoelectric layer 60 is stacked on the upper surface of the cavity plate 20 to cover the plurality of pressure chambers 24. The middle piezoelectric layer 61 is stacked on the bottom piezoelectric layer 60, and the top piezoelectric layer 62 is stacked on the middle piezoelectric layer 61.

The plurality of individual electrodes 63 is arranged on an upper surface of the top piezoelectric layer 62, in an area facing the plurality of pressure chambers 24. Each of the individual electrodes 63, in a plan view, has almost the same shape as the pressure chambers 24, and is provided on the upper surface of the top piezoelectric layer 62, in the entire area facing the pressure chamber 24. The first common electrode 64 is formed continuously in almost entire area between the bottom piezoelectric layer 60 and the middle piezoelectric layer 61. The second common electrode 65 is provided between the middle piezoelectric layer 61 and the top piezoelectric layer 62. Moreover, the second common electrode 65 includes a plurality of electrode portions 65a facing substantially central portions of the plurality of pressure chambers 24, and all of the plurality of electrode portions 65 are in conduction at an area not shown in the diagram.

A driver IC 67 switches an electric potential of the plurality of individual electrodes 63 between the ground electric potential (the first electric potential) and a predetermined driving electric potential (the second electric potential) which differs from the ground electric potential. Moreover, the driver IC 67 keeps an electric potential of the first common electrode 64 to the ground electric potential all the time, and keeps an electric potential of the second common electrode 65 (the plurality of electrode portions 65a) to the driving electric potential all the time. Consequently, when the ground electric potential is applied to a certain individual electrode 63 by the driver IC 67, a voltage is generated between this individual electrode 63 and the second common electrode 65 which is kept at the driving electric potential all the time. Moreover, when the driving electric potential is applied to a certain individual electrode 63 by the drive IC 67, a voltage is generated between this individual electrode 63 and the first common electrode 64 which is kept at the ground electric potential all the time.

Moreover, portions, of the top piezoelectric layer 62 and the middle piezoelectric layer 61, sandwiched between the plurality of individual electrodes 63 and the first common electrode 64 (portions facing a left-end portion and a right-end portion of the pressure chamber 24 in FIG. 7) are polarized in advance in a thickness direction of the piezoelectric layers 61, 62, and the portions are active portions (first active portions 68) in each of which there is a piezoelectric deformation (piezoelectric distortion) when a voltage is applied between one of the individual electrodes 63 and the first common electrode 64 by the driver IC 67. Moreover, portions of the top piezoelectric layer 62 sandwiched between the plurality of individual electrodes 63 and the second common electrode 65 (a portion facing a central portion of the pressure chamber 24 in FIG. 7) are also polarized in advance in the thickness direction, and these portions are active portions (second active portions 69) in each of which there is a piezoelectric deformation when a voltage is applied between one of the individual electrodes 63 and the second common electrode 65, by the driver IC 67.

An operation of the piezoelectric actuator unit 7A described above, at the time of jetting the ink will be described below. As it has been described above, the first common electrode 64 is kept at the ground electric potential all the time, whereas, the second common electrode 65 is kept at the driving electric potential all the time by the driver IC 67. Moreover, in a standby state in which the ink is not jetted (in which the ink is ready to jet), the ground electric potential is applied to all the individual electrodes 63.

In this standby state, an electric field in the thickness direction acts on the second active portion 69 by the voltage applied between the individual electrode 63 and the second common electrode 65. Since a direction of the electric field is parallel to the polarization direction of the second active portion 69, the second active portion 69 contracts in a planar direction orthogonal to the thickness direction. Accordingly, a portion of the piezoelectric layers 60 to 62, facing the pressure chamber 24 deforms to form a projection toward the pressure chamber 24 (a lower side in FIG. 7). At this time, a volume of the pressure chamber 24 becomes small as compared to a volume in a state in which the piezoelectric layers 60 to 62 is not deformed.

When an electric potential of a certain individual electrode is switched from the ground electric potential to the driving electric potential by the driver IC 67, no voltage is applied between this individual electrode 63 and the second common electrode 65. Accordingly, the deformation of the second active portion 69 returns to an original state. Simultaneously, since a voltage is applied between the individual electrode 63 and the first common electrode 64, an electric field in the thickness direction acts on the first active portion 68. Since a direction of the electric field is parallel to the polarization direction of the first active portion 68, the first active portion 68 contracts in the planar direction orthogonal to the thickness direction of the first active portion 68. Accordingly, a portion of the piezoelectric layers 60 to 62 facing the substantially central portion of the pressure chamber 24 is pulled upward, and the portion of the piezoelectric layers 60 to 62 facing the pressure chamber 24 is deformed as a whole to form a projection on an opposite side of the pressure chamber 24 (an upper side in FIG. 7), thereby increasing the volume of the pressure chamber 24.

Thereafter, when the electric potential of the individual electrode 63 is returned to the ground electric potential once again, the voltage is ceased to be applied between the individual electrode 63 and the first common electrode 64, and the deformation of the first active portion 68 returns to the original state. Simultaneously, the second active portion 69 contracts once again in the planar direction, and the portion of the piezoelectric layers 60 to 62 facing the pressure chamber 24 as a whole forms a projection toward the pressure chamber 24. At this time, since the volume of the pressure chamber 24 decreases substantially, a pressure of the ink in the pressure chamber 24 increases, and the ink is jetted from the nozzle 30 communicating with the pressure chamber 24.

Even in the piezoelectric actuator 7A of the second embodiment, similarly as in the first embodiment, when there is a short-circuit between any combinations of the individual electrodes 63, the first common electrode 64, and the second common electrode 65 or a dielectric breakdown of the first active portion 68 and the second active portion 69, there is a possibility that the overcurrent flows through the individual electrode 63, the first common electrode 64, and the second common electrode 65.

Moreover, particularly, in the second embodiment, the ground electric potential and the driving electric potential are applied all the time to the first common electrode 64 and the second common electrode 65 respectively. A portion of the middle piezoelectric layer 61 sandwiched between the first common electrode 64 and the second common electrode 65 becomes a parasitic capacitance portion 70 to which a voltage is applied all the time, in spite of not contributing at all to the drive of the piezoelectric actuator unit 7A. An electric field in the thickness direction acts all the time on this parasitic capacitance portion 70. Therefore, when there is a short-circuit between the first common electrode 64 and the second common electrode 65 in the parasitic capacitance portion 70, the overcurrent flows all the time. As the overcurrent flows all the time, an electrolysis of ink which has entered into the crack is carried out continuously in addition to the problem of a breakdown of circuit components of the driver IC 67, and a problem of a gas generation becomes substantial.

It is possible to form the first common electrode 64 to a shape not facing the second common electrode 65 by patterning the first common electrode 64. However, since the ground electric potential which is a reference electric potential is applied all the time to the first common electrode 64, it is preferable to make an area of the first common electrode 64 as substantial as possible such that a fluctuation of the electric potential of the first common electrode 64 due to switching of the electric potential of the individual electrode 63 is suppressed to be small. Therefore, in the second embodiment, the first common electrode 64 is formed in the entire area on the upper surface of the piezoelectric layer 60, and not patterned.

Therefore, the piezoelectric actuator unit 7A of the second embodiment, similarly as in the first embodiment, is structured such that, even when there is a short-circuit between any combinations of the individual electrode 63, the first common electrode 64, and the second common electrode 65, or a dielectric breakdown of the first active portion 68 and the second active portion 69, the overcurrent is prevented from flowing between the individual electrode 63, the first common electrode 64, and the second common electrode 65.

Figure 8:
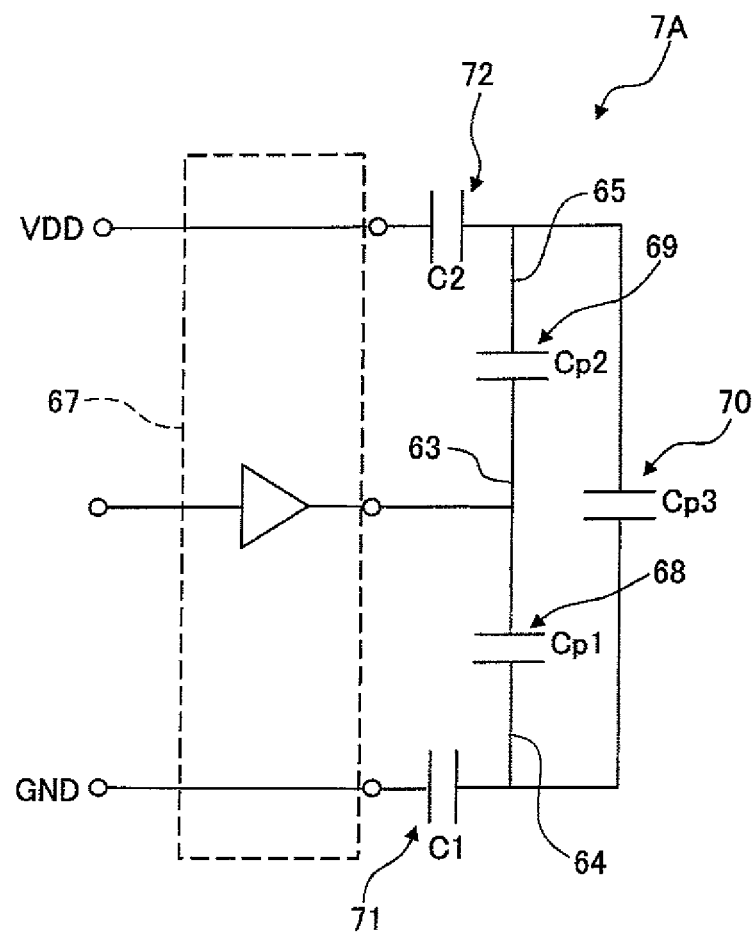
FIG. 8 is a diagram of an equivalent circuit of a piezoelectric actuator unit according to the second embodiment.

In an equivalent circuit shown in FIG. 8, the first active portion 68 sandwiched between the individual electrode 63 and the first common electrode 64 is indicated by a capacitor of an electrostatic capacity Cp1, and the second active portion 69 sandwiched between the individual electrode 63 and the second common electrode 65 is indicated by a capacitor of an electrostatic capacity Cp2. Moreover, the parasitic capacitance portion 70 sandwiched between the first common electrode 64 and the second common electrode 65 is indicated by a capacitor of an electrostatic capacity Cp3. The first common electrode 64 is connected to a ground terminal (GND) of the driver IC 67 via a capacitor 71, and the ground electric potential is substantially applied thereon all the time. The second common electrode 65 is connected, via a capacitor 72, to a feed terminal (VDD) of the driver IC 67 which is connected to a power supply not shown in the diagram, and the driving electric potential is substantially applied thereon all the time. Moreover, one of the ground electric potential and the driving electric potential is selectively applied to the individual electrode 63.

Furthermore, the capacitor 71 of an electrostatic capacity C1 which is connected in series to the first active portion 68, is provided between the first common electrode 64 and the ground terminal of the driver IC 67. Moreover, the capacitor 72 of an electrostatic capacity C2 which is connected in series to the second active portion 69 is provided between the second common electrode 65 and the feed terminal of the driver IC 67.

Since the first common electrode 64 and the driver IC 67 are isolated by the capacitor 71, the overcurrent does not flow between the first common electrode 64 and the individual electrode 63. Moreover, since the second common electrode 65 and the driver IC 67 are isolated by the capacitor 72, the overcurrent does not flow between the second common electrode 65 and the individual electrode 63. Furthermore, the overcurrent between the first common electrode 64 and the second common electrode 65 is prevented by the capacitors 71 and 72.

Arranging capacitors between the individual electrodes 63 and the driver IC 67 may be taken into consideration. In this case, it is necessary to provide a plurality of capacitors between the plurality of individual electrodes 63 and the driver IC 67 respectively. Moreover, it is not possible to prevent the overcurrent from flowing through the parasitic capacitance portion 70 only by providing the capacitors between the individual electrodes 63 and the driver IC 67. On the other hand, in the second embodiment, only by providing one each of the capacitors 71 and 72 toward the first common electrode 64 and the second common electrode 65, it is possible to prevent completely the overcurrent between any combinations of the individual electrode 63, the first common electrode 64, and the second common electrode 65 (between the individual electrode 63 and the second common electrode 65, between the individual electrode 63 and the first common electrode 64, and between the first common electrode 64 and the second common electrode 65).

It is preferable that the electrostatic capacity C1 of the capacitor 71 is greater than the total electrostatic capacitance (n×Cp1) of the first active portions 68, and it is preferable that the electrostatic capacity C2 of the capacitor 72 is greater than the total electrostatic capacitance (n×Cp2) of the second active portions 69. Here, "n" indicates the number of the first active portions 68 and the number of the second active portions 69. In the piezoelectric actuator unit 7A shown in FIG. 7, each of the first active portions 68 is thicker than one of the second active portions 69, and each of areas of the individual electrodes 63 overlapping with the first common electrode 64 is smaller than one of areas of the individual electrodes 63 overlapping with the second common electrode 65. Therefore, the electrostatic capacity Cp1 of each of the first active portions 68 is smaller (lower) than the electrostatic capacity Cp2 of one of the second active portions 69. In this case, the electrostatic capacity C1 of the capacitor 71 may be smaller than the electrostatic capacity C2 of the capacitor 72. Furthermore, similarly as in the first embodiment, it is preferable to determine the electrostatic capacity C1 and the electrostatic capacity C2 of the capacitors 71 and 72 upon taking into consideration the voltage loss in the capacitors 71 and 72. Concretely, it is preferable to determined the electrostatic capacity C1 and the electrostatic capacity C2 of the capacitors 71 and 72 such that, a variation in the voltage applied to the plurality of first active portions 68 and to the plurality of second active portions 69 is accommodated within a range which does not have an effect on the jetting characteristics of ink. Moreover, similarly as a case in the first embodiment, it is possible to detect whether or not the overcurrent flows through first active portion 68, the second active portion 69, and the parasitic capacitance portion 70 by monitoring the voltage applied to the capacitors 71 and 72 by the voltage detector 101 such as a voltmeter or the like.

The piezoelectric actuator unit of the first embodiment and the second embodiment is shown as an example of a structure to which the present teachings are applicable, and the present teachings are not restricted to these structures.

For instance, in the first embodiment and the second embodiment, each of the active portions of the piezoelectric layer is a portion sandwiched between the two types of electrodes in the thickness direction of the piezoelectric layer. However, the two types of electrodes may be formed on one surface of the piezoelectric layer so that a portion of the piezoelectric layer is sandwiched between the two types of electrodes in a planar direction. That is, the active portion may be formed in a surface layer portion of one surface of the piezoelectric layer. Moreover, the types of electrodes are not restricted to two types or three types, and electrodes of four types or more to which mutually different electric potential may be applied, may be provided to the piezoelectric layer.

In the first embodiment and the second embodiment, each of the capacitors 50, 71 and 72 is formed of a single capacitor element. However, the present teaching is not restricted to these embodiments. Each of the capacitors 50, 71 and 72 may be formed of a plurality of capacitor elements. In this case, the electrostatic capacity of each of the capacitors 50, 71 and 72 corresponds to a total electrostatic capacity of the capacitor elements forming one of the capacitors 50, 71 and 72. Therefore, the total electrostatic capacity of the capacitor elements forming each of the capacitors 50, 71 and 72 may be set not to be less than the right-side value in Eq. 3. Further, positions at which the capacitors 50, 71 and 72 are arranged are not restricted to particular positions. For example, any one of the capacitors 50, 71 and 72 may be arranged on the piezoelectric layer 41 (62) of the piezoelectric actuator unit 7 (7A). In this case, the capacitors 50, 71 and 72 may be arranged directly on the piezoelectric layer 41 (62) or arranged indirectly on the piezoelectric layer 41 (62) via another element such as an insulating layer. Alternatively, when the driver IC 47 (67) and the piezoelectric actuator unit 7 (7A) are connected by a flexible wiring member such as an FPC or a COF, the capacitors 50, 71 and 72 may be arranged on this flexible wiring member. As described above, the capacitors 50, 71 and 72 may be arranged on the piezoelectric layer 41 (62) or on the flexible wiring member. The arrangement of the capacitors 50, 71 and 72 may be determined based on, for example, the number and/or the external sizes of the capacitor elements forming the capacitors 50, 71 and 72. Especially, it is favorable to arrange the capacitors 50, 71 and 72 on the flexible wiring member, when it is difficult to arrange the capacitors 50, 71, and 72 on the piezoelectric layer 41 (62) due to the number and/or sizes of the of the capacitor elements forming the capacitors 50, 71 and 72. In these cases, a capacitor of an arbitrary type such as an electrolytic capacitor, a film capacitor, and a ceramic capacitor may be used. For achieving a high-frequency driving of a piezoelectric actuator, it is preferable to use a capacitor having favorable frequency response characteristics, such as a film capacitor and a ceramic capacitor. Or, instead of using a capacitor as an electric element, a dummy actuator may be formed in the piezoelectric actuators 7 and 7A, and this dummy actuator may be used as a capacitor. For instance, a set of dummy electrodes sandwiching the piezoelectric layer may be formed in a portion of the piezoelectric layer, not facing the pressure chamber.

In the first embodiment and the second embodiment, the present teachings are applied to a piezoelectric actuator for an ink-jet head which records an image etc. by jetting an ink onto a recording paper. However, the application of the present teachings is not restricted to such piezoelectric actuator for an ink-jet head, and may be applied to a piezoelectric actuator which is used for an arbitrary application. For instance, the application of the present teachings is not restricted to a piezoelectric actuator which is used in an apparatus handling a liquid. As a dielectric breakdown of an active portion or a short-circuit between electrodes due to migration may occur even in a piezoelectric actuator which is used in an environment in which an electroconductive liquid is not adhered, it is significant to apply the present teachings to such piezoelectric actuator.

What is claimed is:

1. A piezoelectric actuator unit comprising:
a piezoelectric layer;
a first electrode and a second electrode which are arranged to sandwich the piezoelectric layer therebetween to form a substantive capacitor element in which an active portion of the piezoelectric layer sandwiched between the first and second electrodes is defined, the first electrode includes a plurality of individual electrodes, and the second electrode includes a first common electrode and a second common electrode both of which are provided in common to the individual electrodes, and the active portion includes a plurality of first active portions each of which is sandwiched between one of the individual electrodes and the first common electrode, and a plurality of second active portions each of which is sandwiched between one of the individual electrodes and the second common electrode,
the substantive capacitor element includes:
a plurality of first substantive capacitor elements each of which has one of the individual electrodes, the first common electrode and one of the first active portions sandwiched between the one of the individual electrodes and the first common electrode; and
a plurality of second substantive capacitor elements each of which has one of the individual electrodes, the second common electrode and one of the second active portions sandwiched between the one of the individual electrodes and the second common electrode;
a capacitor which is connected in series to the substantive capacitor element; and
a voltage applying mechanism which applies a first voltage to the capacitor, and applies a second voltage between the first electrode and the second electrode of the substantive capacitor element to cause a piezoelectric deformation in the active portion of the piezoelectric layer,
the capacitor includes a first capacitor which is arranged between the first common electrode and the voltage applying mechanism, and a second capacitor which is arranged between the second common electrode and the voltage applying mechanism,
the voltage applying mechanism applies a first electric potential to the first common electrode via the first capacitor at all time, applies a second electric potential which is different from the first electric potential to the second common electrode via the second capacitor at all time, and switches an electric potential of each of the individual electrodes between the first electric potential and the second electric potential, and
the first capacitor is connected to the plurality of first substantive capacitor elements commonly, and the second capacitor is connected to the plurality of second substantive capacitor elements commonly.

2. The piezoelectric actuator unit according to claim 1, wherein an electrostatic capacity of the capacitor is greater than an electrostatic capacity of the substantive capacitor element.

3. The piezoelectric actuator unit according to claim 1, wherein the piezoelectric layer includes a parasitic capacitance portion which is sandwiched between the first common electrode and the second common electrode.

4. The piezoelectric actuator unit according to claim 1, wherein the capacitor is one of a film capacitor and a ceramic capacitor.

5. The piezoelectric actuator unit according to claim 4, further comprising a flexible wiring member which electrically connects between the first electrode and the voltage applied mechanism and between the second electrode and the voltage applied mechanism, wherein the capacitor is arranged on the flexible wiring member.

6. The piezoelectric actuator unit according to claim 1, wherein an electrostatic capacity of the capacitor is greater than a total electrostatic capacity of the plurality of first and second substantive capacitor elements.

7. The piezoelectric actuator unit according to claim 1, wherein an electrostatic capacity of the first capacitor is greater than a total electrostatic capacity of the first substantive capacitor elements, and an electrostatic capacity of the second capacitor is greater than a total electrostatic capacity of the second substantive capacitor elements.

8. The piezoelectric actuator unit according to claim 1, further comprising a voltage detector which detects whether or not the first voltage is applied to the capacitor.

9. The piezoelectric actuator unit according to claim 2, wherein under a condition that the first voltage is V1, the second voltage is V2, the electrostatic capacity of the capacitor is C0, the electrostatic capacity of the substantive capacitor element is Cp, a minimum voltage required for causing the piezoelectric deformation in the active portion of the piezoelectric layer is Vp, and an allowable ratio $\alpha$ is defined as $\alpha=Vp/(V1+V2)$, the piezoelectric actuator unit satisfies $$C0 \geq \alpha \cdot Cp/(1-\alpha).$$

10. A liquid transporting apparatus which transports a liquid, comprising:
a channel unit in which liquid channels including pressure chambers are formed; and
the piezoelectric actuator unit as defined in claim 1, which is arranged on the channel unit and which applies a pressure to the liquid in the pressure chambers,
wherein the piezoelectric layer is arranged to cover the pressure chambers; and
the first and second electrode are provided as first electrodes and second electrodes which are arranged in areas, of the piezoelectric layer, facing the pressure chambers, and which are arranged to sandwich the piezoelectric layer therebetween to form a substantive capacitor element in which active portions of the piezoelectric layer sandwiched between the first and second electrodes are defined.

11. The piezoelectric actuator unit according to claim 1, wherein the voltage applying mechanism is configured to apply a voltage to both ends of a serial circuit including the substantive capacitor and the capacitor that is serially connected.

12. The piezoelectric actuator unit according to claim 11, wherein the voltage applying mechanism is configured to apply the voltage to the serial circuit so that the voltage is divided into the first voltage applied to the capacitor and the second voltage applied to the substantive capacitor element.

13. The piezoelectric actuator unit according to claim 11, wherein the voltage applying mechanism is configured to apply a pulsed voltage to the capacitor and the substantive capacitor element.

14. The piezoelectric actuator unit according to claim 1, wherein each of the first and second substantive capacitor elements includes a pair of electrodes and a portion of the piezoelectric layer sandwiched between the pair of electrodes.

* * * * *